United States Patent [19]

Giboulet et al.

[11] Patent Number: 5,170,050
[45] Date of Patent: Dec. 8, 1992

[54] DETECTION DEVICE OF AN INTERNAL ARC IN A METALCLAD ELECTRICAL INSTALLATION INCLUDING A LIGHT-GATHERING ROD

[75] Inventors: André Giboulet, Grenoble, France; Bruno Maffioletti, Bergamo, Italy; Ettore Giudici, Bergamo, Italy; Massimo Allevi, Bergamo, Italy; Antonio Codazzi, Bergamo, Italy

[73] Assignee: Merlin Gerin, France

[21] Appl. No.: 660,005

[22] Filed: Feb. 25, 1991

[30] Foreign Application Priority Data

Feb. 26, 1990 [FR] France .................... 90 02477

[51] Int. Cl.⁵ ............................. H01J 5/16
[52] U.S. Cl. ..................... 250/227.11; 250/227.24
[58] Field of Search .............. 250/227.11, 227.31, 250/551, 227.24; 385/2, 900

[56] References Cited

U.S. PATENT DOCUMENTS 3,949,226  4/1976  Dugan et al. .............. 250/227.11
4,245,154  1/1981  Uehara et al. .............. 250/551
4,369,364  1/1983  Kuntermann ............... 250/227.11

FOREIGN PATENT DOCUMENTS 505420   9/1951  Belgium .
0115843  8/1984  European Pat. Off. .
2447240  3/1976  Fed. Rep. of Germany .
3612090 10/1987  Fed. Rep. of Germany .
665313   4/1988  Switzerland .

OTHER PUBLICATIONS

Elektrotechnische Zeitschrift, vol. 98, No. 7, Jul. 1977, p. 491, P. Gehrmann.

Primary Examiner—David C. Nelms
Attorney, Agent, or Firm—Parkhurst, Wendel & Rossi

[57] ABSTRACT

An optic sensor comprises a transparent rod passing through a wall of a sealed enclosure of a gas-insulated electrical installation. The internally protruding end of the rod comprises frustum-shaped reflecting faces of a light ray parallel to the wall. This ray is reflected perpendicularly to an optic fiber which transmits the signal to an alarm device.

6 Claims, 2 Drawing Sheets

DETECTION DEVICE OF AN INTERNAL ARC IN A METALCLAD ELECTRICAL INSTALLATION INCLUDING A LIGHT-GATHERING ROD

BACKGROUND OF THE INVENTION

The invention relates to an arc detector for a gas-insulated electrical installation having an elongated sealed enclosure filled with a high dielectric strength gas, comprising an optic light sensor located in said enclosure and an optic fiber to transmit the light signal supplied by the sensor to a processing device located outside the enclosure.

Internal flashover can cause a large amount of damage in an electrical installation, for example in a metalclad substation, when the fault is not detected and cleared quickly. It is state-of-the-art practice to fit photoelectric cells inside the substation to detect the occurrence of an arc at any point in the substation. These systems are complicated and of uncertain reliability.

Another state-of-the-art arc detector makes use of an optic fiber extending inside the substation to collect the light emitted inside the substation and transmit it to a processing unit which controls tripping of the protective circuit breaker. The sensitivity of this detector is limited and the presence of the fiber in the substation imposes constraints and affects the dielectric withstand.

The object of the present invention is to achieve a simple arc detector, able to monitor large volumes of the substation without diminishing the dielectric withstand.

SUMMARY OF THE INVENTION

The arc detector according to the invention is characterized in that the sensor comprises a transparent rod made of glass or synthetic insulating material, which passes tightly through the wall of the enclosure with one end protruding slightly into the enclosure. The end has a reflecting face internal to the enclosure for reflecting a light ray generated by an arc along the axis of the rod and outside the enclosure.

Only a small part of the rod penetrates inside the enclosure, but this part is shaped to capture light rays from all directions, notably rays parallel to the wall of the enclosure which strike the rod perpendicularly. In an elongated enclosure, such as a busbar, a single sensor can monitor a great length or even the whole length of the busbar, if care is taken to avoid any opaque internal partitions. Particularly the support insulators of the bar may have orifices for the light to pass through.

The reflecting face of the rod is preferably inclined 45° on the axis of the rod so as to reflect a ray travelling perpendicular to the axis of the rod to the outside of the enclosure through which the rod passes. The rod is advantageously of circular cross-section with a protruding or sunken frustum-shaped reflecting face. The height of this frustum-shaped face corresponds appreciably to the internal protrusion height of the rod and the optic sensor is preferably securely united to an upper wall of the enclosure.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
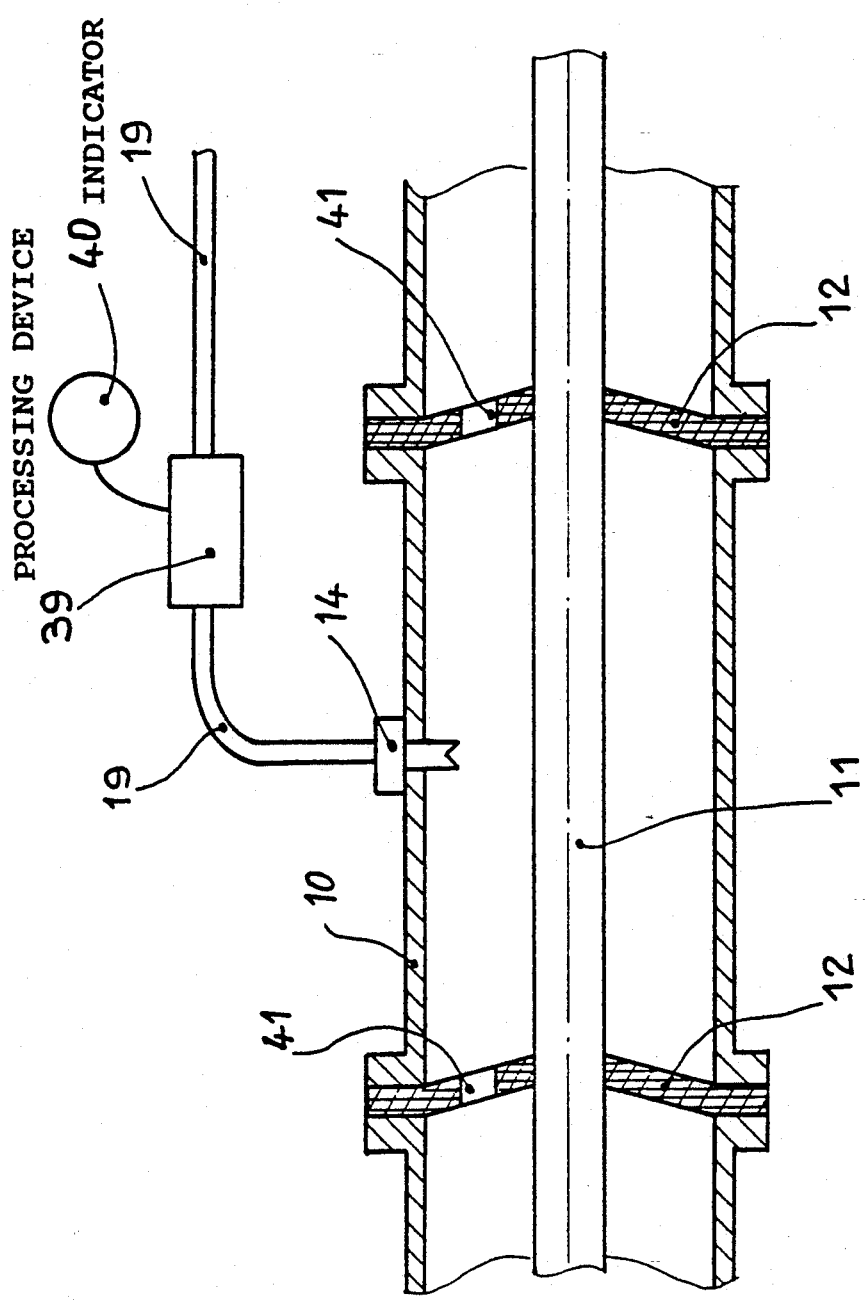
FIG. 1 is a schematic cross-sectional view of a busbar equipped with an arc detector according to the invention.

In the figures, a busbar of a metalclad substation comprises a sealed enclosure with a cylindrical wall 10, filled with a high dielectric strength gas, such as sulphur hexafluoride, and containing a conducting bar 11, coaxially supported by support insulators 12 located at intervals along the bar 11. In a threaded orifice 13, arranged in the wall 10 of the enclosure or in a sleeve welded to this wall there is screwed an arc detector 14, passing tightly through the wall 10. The detector 14 is formed by an adaptor 15 having a threaded front part 16, which screws into the wall 10, an intermediate collar 17 with a hexagonal gripping head and a threaded rear part 18 for screw connection of an optic conductor 19. The adaptor 15 has passing through it an axial passage 20 accommodating in the rear part 16 a rod 23 made of glass or transparent synthetic insulating material, tightly sealed by two O-rings 21 and/or by sticking 22. In the rear part 18 of the passage 20 of smaller cross-section there is fitted in alignment with the rod 23 the bared end 24 of an optic fiber 25. The optic conductor 19 is fixed by means of a sleeve 26 fitted over the bared end 24 and over a section of the sheath 27 of the fiber 25. This sleeve 26 has a collar 28 held against the face of the rear part 18 by a nut 29, screwed onto this threaded rear part 18. An O-ring 30 is inserted between the collar 28 and the bearing face 18. The tightness between the adaptor 15 and wall 10 is achieved by O-rings 31 in the usual way. Between the terminal face 32 of the optic fiber 25 and the rounded end 33 of the rod 23 facing it, there is arranged a frustum-shaped connecting gap 34. The metal adaptor 15 is, in the fixing position of the arc detector 14, slightly away from the wall 10 in order not to disturb the electrical insulation, whereas the rod 23 protrudes out from the adaptor 15 and the wall 10 penetrating over a reduced height h inside the enclosure. This slight protuberance of an insulating part 23 does not affect the dielectric withstand.

Figure 2:
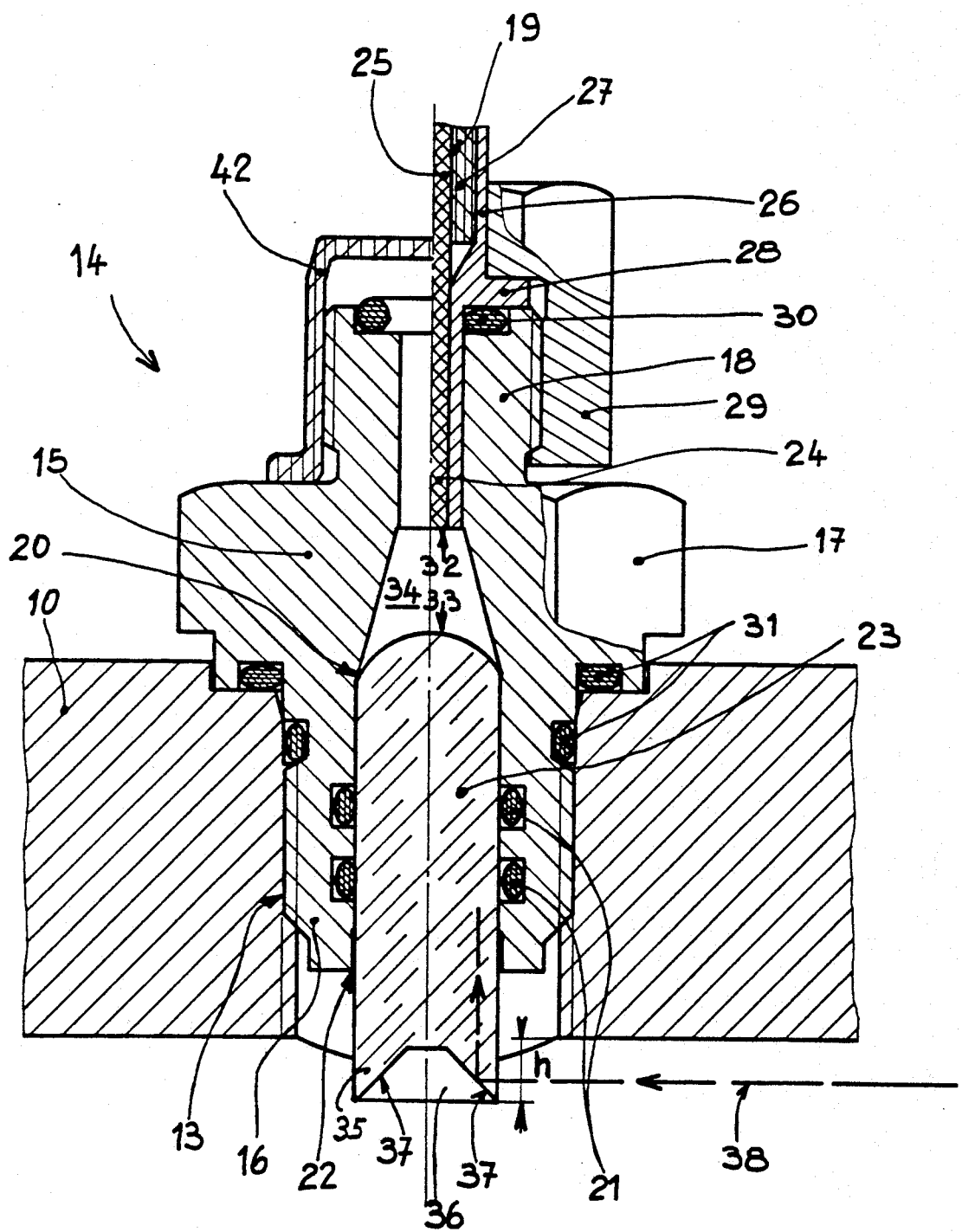
FIG. 2 is an enlarged scale view of the detector according to FIG. 1, represented in the right-hand half-view coupled to the optic fiber and in the left-hand half-view before coupling of the fiber.

In the example illustrated by FIG. 2, the rod 23 is of cylindrical cross-section and the protruding internal end 35 has a frustum-shaped internal cavity in the form of a funnel 36 whose depth corresponds appreciably to the protrusion height h. The frustum-shaped faces 37 are inclined approximately 45° on the axis of the rod 23 and constitute reflecting faces for light ray 38, notably a ray parallel to the wall 10, which is reflected 90° in the direction of the axis of the rod 23 towards the optic fiber 25. The rod 23 also captures rays oriented differently, in particular along the axis of the rod 23.

The optic conductor 19 is connected to a processing device 39, which can be common to several sensors 14 and which transforms the light signals transmitted by the optic conductors 19 into a tripping or fault indicator 40. By providing orifices 41 in the support insulators 12 for the light rays 38 to pass through, a single sensor 14 can monitor several compartments of the busbar or enclosure. It can be understood that the rays 38, emitted from a point far from the sensor 14, are appreciably parallel to the wall 10 and strike the rod 23 perpendicularly. The reflecting faces 37 capture these rays 38 which would simply pass through the rod 23 if such faces 37 were absent. The reflecting faces 37 can be in convex protrusion and/or be formed by facettes or plane faces oriented along the axis of the bar 11. The sensor 14 is advantageously secured to the upper wall 10 so as to face downwards and to avoid deposits forming a screen preventing the light from passing. The rod 23 is preferably made of transparent plastic material, but other materials can be used and the connection between the rod 23 and the optic fiber can be achieved by abutment of the two facing ends 32, 33. The optic conductor 19 of standard type can easily be fitted or removed after the nut 29 has been unscrewed. The left-hand part of FIG. 2 shows the sensor 14 before connection of the optic conductor 19 with a protective cover 42 screwed onto the rear part 18 in order to avoid damage during transport. After the substation has been assembled the cover 42 merely has to be removed and the optic conductor 19 fitted by inserting the end 24 and tightening the nut 29.

The sensor 14 hardly penetrates inside the enclosure and can therefore be fixed at any point, wherever is most suitable. A limited number of sensors 14 and therefore of orifices 13 in the wall 10 allows full monitoring of the whole installation. The cross-section of these orifices 13 can be small and the tightness and fixing of the rod 23, which passes perpendicularly through the wall 10, can naturally be achieved differently.

We claim:

1. An arc detector for an elongated sealed enclosure having a high dielectric strength gas sealed therein, said enclosure being at least partially defined by a wall and having a longitudinal axis, comprising:

an optic sensor comprising a transparent rod passing gas-tightly into said enclosure through said wall, said rod having a protrusion having a reflecting face inclined substantially 45° with respect to said longitudinal axis of said enclosure to reflect light travelling substantially parallel to said longitudinal axis toward an exterior of said enclosure, said light being generated from an arc generated in said enclosure;

an optic fiber for receiving and transmitting said light from said transparent rod; and a processing device located outside said enclosure for receiving said light transmitted from said optic fiber.

2. The device of claim 1, further comprising an O-ring interposed between said wall of the enclosure and said rod, said rod passing perpendicularly through said wall of said enclosure, said optical fiber facing an external end of said rod opposite said protrusion of said rod.

3. The device of claim 1, wherein said sealed enclosure includes support insulators disposed along said longitudinal axis, said insulators having orifices for passage of light.

4. An arc detector for an elongated sealed enclosure having a high dielectric strength gas sealed therein, said enclosure being at least partially defined by a wall and having a longitudinal axis comprising:

an optic sensor comprising a transparent rod passing gas-tightly into said enclosure through said wall, said rod having a protrusion having a reflecting face inclined substantially 45° with respect to said longitudinal axis of said enclosure to reflect light travelling substantially parallel to said longitudinal axis toward an exterior of said enclosure, said light being generated from an arc generated in said enclosure, wherein said rod is substantially cylindrical and said reflecting face defines a frustum coaxial with said transparent rod, said frustum having an apex angle of substantially 90°;

an optic fiber for receiving and transmitting said light from said transparent rod; and a processing device located outside said enclosure for receiving said light transmitted from said optic fiber.

5. The device of claim 4, wherein said frustum forms a funnel-shaped cavity in said protrusion.

6. The device of claim 5, wherein said cavity has a depth approximately equal to the length of said protrusion.

* * * * *